United States Patent [19]

Purdes

[11] Patent Number: 5,006,203
[45] Date of Patent: Apr. 9, 1991

[54] DIAMOND GROWTH METHOD

[75] Inventor: Andrew J. Purdes, Garland, Tex.

[73] Assignee: Texas Instruments Incorporated, Dallas, Tex.

[21] Appl. No.: 231,750

[22] Filed: Aug. 12, 1988

[51] Int. Cl.$^5$ .................. B44C 1/22; C03C 15/00; C03C 25/06
[52] U.S. Cl. .................. 156/646; 156/645; 156/655; 156/657; 156/662; 156/612; 156/DIG. 68; 204/192.11; 252/79.1; 423/446; 427/38
[58] Field of Search .............. 156/643, 645, 646, 655, 156/657, 662, 610, 612, 614, DIG. 68; 204/192.11, 192.12; 252/79.1, 79.3; 423/446; 427/38

[56] References Cited

U.S. PATENT DOCUMENTS

| | | | |
|---|---|---|---|
| 3,661,526 | 5/1972 | Angus et al. | 156/DIG. 68 |
| 3,969,489 | 7/1976 | Wu | 423/446 |
| 4,504,519 | 3/1985 | Zelez | 423/446 X |
| 4,544,540 | 10/1985 | Tsuji | 156/DIG. 68 |
| 4,859,490 | 8/1989 | Ikegaya | 427/38 |

Primary Examiner—William A. Powell
Attorney, Agent, or Firm—James C. Kesterson; James T. Comfort; Melvin Sharp

[57] ABSTRACT

Preferred embodiments first adjust reactor conditions to grow a diamondlike film (114) on a silicon substrate (102). Reactor conditions are then adjusted to etch the diamondlike film surface, providing a high density of diamond nucleation sites (108). Finally, the reactor conditions are adjusted to grow a uniform diamond film (116) on the conditioned diamondlike surface.

9 Claims, 3 Drawing Sheets

DIAMOND GROWTH METHOD

BACKGROUND OF THE INVENTION

1. Field of the Invention

The present invention relates to growth of films of material, and, more particularly, to the growth of diamond-type films and related devices.

2. Description of the Related Art

Diamond is a useful industrial material, providing hard surfaces for cutting tools, coatings for infrared optics, and thermally conductive electrical insulators for electronic devices. Synthetic diamonds have been produced under high-pressure and high-temperature conditions since 1955; and polycrystalline diamond films can be grown at moderate temperatures and pressures. See D. Vitkavage et al, Plasma Enhanced Chemical Vapor Deposition of Polycrystalline Diamond and Diamond-like Films, 6 J. Vac.Sci.Tech. A 1812 (1988). U.S. Pat. Nos. 3,030,187 and 3,030,188 disclose pyrolysis of hydrocarbon gases to deposit diamond despite the thermoaynamic preference for graphite formation by including hydrogen gas which preferentially reacts with graphite and removes it. Similarly, diamondlike films, which are amorphous and contain a large fraction of carbon bonds in the $sp^2$ configuration, can be formed by rf plasma deposition, low-energy ion beam deposition, dc glow discharge deposition, and sputtering. See J. Angus et al, Dense "Diamond-like" Hydrocarbons as Random Covalent Networks, 6 J.Vac.Sci.Tech. A 1778 (1988). However, diamondlike films have inferior hardness for use as cutting tool coatings and have inferior thermal conductivity for use with electronic devices.

The known methods of growth of diamond films on non-diamond substrates have the problem of formation of nucleation sites. The most common substrate preparation procedure includes abrasion with diamond grit. It is believed that small imbedded diamonds act as nucleation sites for the subsequent diamond film growth. But even with diamond-grit-abrasion substrate preparation, grown diamond "films" more closely resemble loose piles of individual diamonds; the nucleation density is apparently too low to readily from a continuous diamond film. This problem is especially severe for those growth conditions that produce the most perfect diamond, as gauged by SEM and Raman spectra. For example, decomposition of a mixture of methane in hydrogen over a hot silicon substrate will yield reasonable diamond quality but have low nucleation density (and high porosity) for low methane concentrations (e.g., 0.5%) but will yield diamondlike films which have poor crystallinity but good surface coverage and low porosity for higher methane concentrations (e.g., 2%).

SUMMARY OF THE INVENTION

The present invention provides a multistep diamond film growth method and devices fabricated by this method: the first step grows a film under conditions yielding good film coverage (diamondlike); this diamondlike layer is then etched with atomic hydrogen to preferentially remove graphitic-bonded material, resulting in a primarily diamond-bonded surface; the final step grows a film under conditions yielding a high quality diamond layer.

Preferred embodiments include growth of diamondlike films on silicon substrates and cutting tools by various means, such as hydrocarbon pyrolysis or ion beam deposition, followed by an atomic hydrogen surface treatment to preferentially remove graphitically-bonded material, providing a high nucleation density surface for the growth of high quality diamond films. Further preferred embodiments omit the atomic hydrogen surface treatment step.

This invention solves the problem of nucleating diamond films on non-diamond substrates by providing a high diamond nucleation density on the surface of a hydrogen-etched diamondlike layer.

BRIEF DESCRIPTION OF THE DRAWINGS

The drawings are schematic for clarity.

FIGS. 4a–d illustrate the steps of fourth preferred embodiment method and devices wherein:

4a—diamond deposition
4b—polysilicon deposition
4c—bulk silicon removal
4d—devices formed in silicon-on-diamond

DESCRIPTION OF THE PREFERRED EMBODIMENTS

A first preferred embodiment method of growing a diamond film is schematically illustrated in cross sectional elevation views in FIGS. 2a–d and includes the following steps.

Figure 2A:
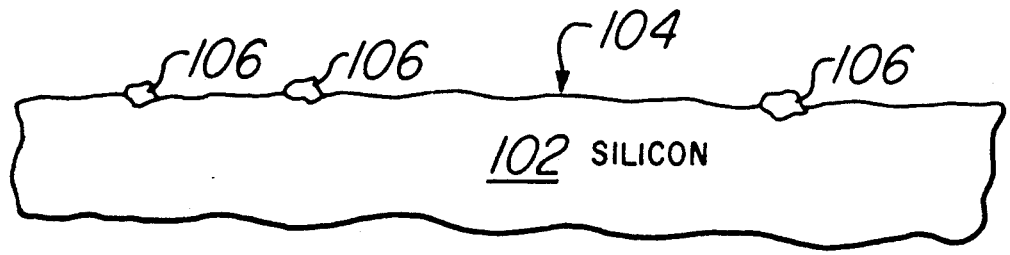
FIGS. 2a–d are cross sectional elevation views of steps of a first preferred embodiment method of diamond film growth.

(a) Clean silicon substrate 102 with dilute HF or other standard semiconductor industry processes. To enhance the formation rate of the subsequently grown film, surface 104 may be abraded using a diamond grit having a particle size of about 1 micron. After cleaning the loose diamond grit from the substrate, surface 104 contains small emdedded diamonds 106 which can act as nucleation sites (FIG. 2a).

Figure 1:
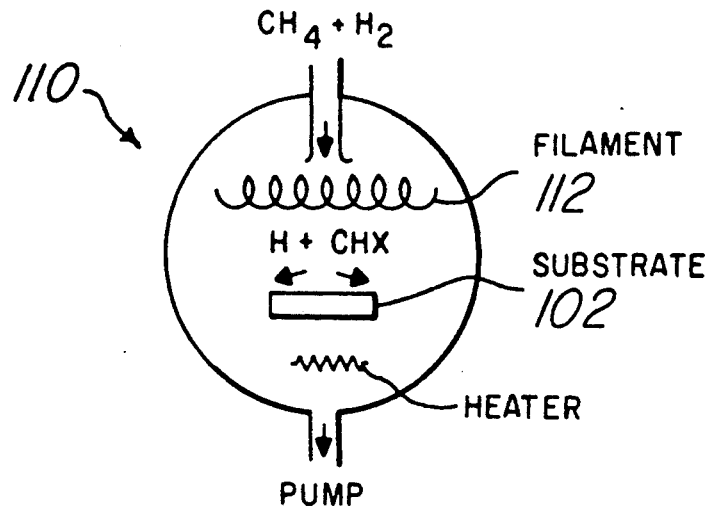
FIG. 1 is a cross sectional elevation view of a reactor for diamond film growth (hot filament growth)
Figure 2B:
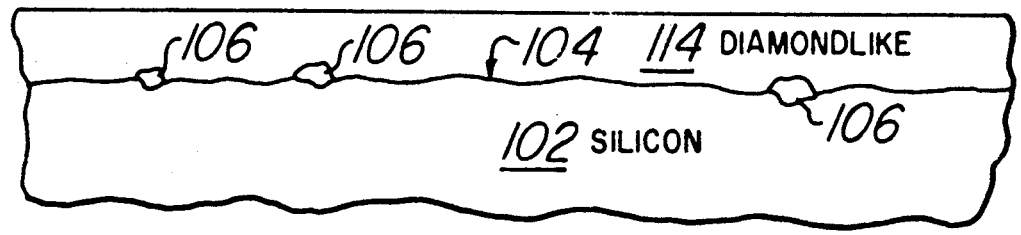
Figure 2C:
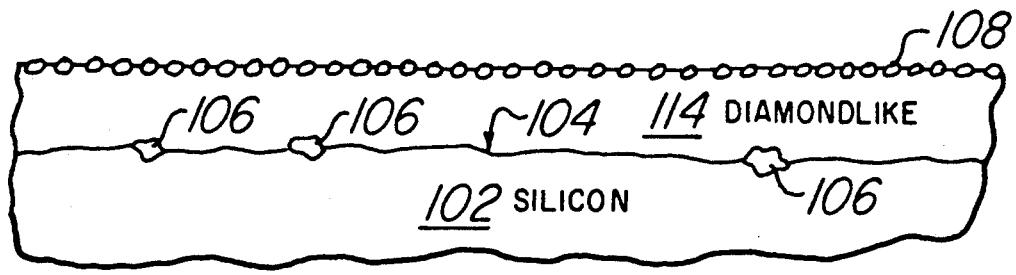
Figure 2D:
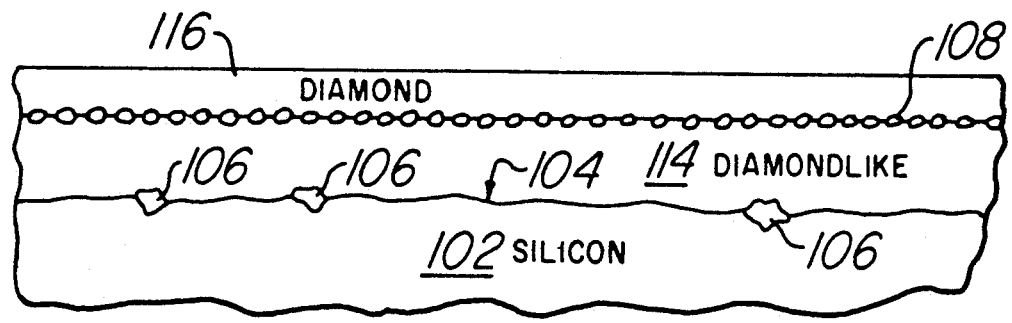

(b) Insert the prepared substrate 102 into a hot filament deposition reactor 110 as shown in FIG. 1. Reactor 110 is evacuated and substrate 102 is heated to a temperature of about 1000 C. and filament 112 is heated to about 2000 C. A gaseous flow of about 150 sccm of 2% methane in hydrogen in then introduced into the reactor at a pressure of about 30 Torr. These conditions crack the incoming gases into atomic hydrogen and free radicals such as $CH_3$, resulting in deposition of diamondlike film 114 as shown in FIG. 2b. The growth rate is about 1 micron/hr. Note that the crystallites 106 act as nucleation sites which speed the formation of a continuous diamondlike film.

(c) Change the mixture of the gaseous flow through reactor 110 to pure hydrogen for a duration of about 30 minutes. The graphitic-bonded material in the surface of diamondlike film 114 is preferentially etched away by the atomic hydrogen. The resulting etched surface has a very high density of diamond-bonded sites 108 to nucleate a subsequently overgrown film. A negligible amount of film 114 is removed by the atomic hydrogen etching; see FIG. 2c.

(d) Change the mixture of the gaseous flow through reactor 110 to 1% methane in hydrogen. These conditions are suitable for the growth of a high quality diamond layer 116. The high density of nucleation sites 108 ensure that this diamond layer 116 will grow uniformly over the surface of the diamondlike layer 114. The growth rate of the diamond layer is also about 1 micron/hr. See FIG. 2d.

Figure 3:
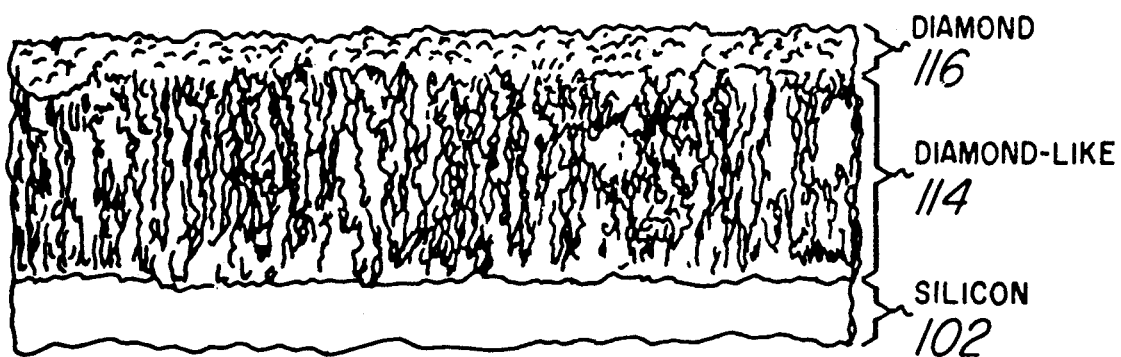
FIG. 3 is a cross sectional elevation SEM of a first preferred embodiment diamond film structure.

FIG. 3 shows an SEM cross sectional view of a film grown using the multistep sequence illustrated in FIGS. 2a–d. The particular film shown in FIG. 3 has a relatively thick (5 micron) diamondlike layer 114 followed by a relatively thin (1 micron) diamond layer 116. The relative film thickness can be varied at will. However, the thickness of the diamondlike layer should be sufficiently thick to form a continuous layer.

A second preferred embodiment method is similar to the first preferred embodiment except that the diamond grit abrasion step is omitted in step (a). The diamondlike layer can be deposited by the thermal decomposition method previously described. Alternatively, other methods such as rf deposition, dual ion beam sputter deposition or direct ion beam deposition may be used to grow the initial diamondlike layer. These alternate methods may have the advantage of forming continuous diamondlike films at a lower thickness. Again, this diamondlike layer is etched using atomic hydrogen to preferentially remove the graphitically-bonded material from the diamondlike surface. The diamond layer is then deposited using a method similar to that described in step (d) of the first preferred embodiment. This second preferred embodiment method may be used to coat a drill; for example, deposit a 1 micron thick diamondlike layer on a molybdenum-coated steel drill by direct ion beam deposition, next atomic hydrogen etch the diamondlike layer, and then grow a 10 micron thick layer of diamond in reactor 110 with 0.5% methane in hydrogen.

A third preferred embodiment deposits a diamondlike layer using means such as described in the first and second preferred embodiment methods. However, in the third preferred embodiment method the diamondlike film is not subjected to an atomic etching treatment. Relying upon the natural density of diamond-bonded sites on the diamondlike surface, the conditions for diamond growth are immediately established. For example, the growth of a diamondlike film with 2% methane in hydrogen would be immediately followed by growth using 1% methane in hydrogen.

FIGS. 4a–d schematically illustrate in cross sectional elevation views a fourth preferred embodiment method of fabrication of silicon devices 230 on silicon-on-diamond layers 208/210 which has backside diamondlike film 214 and diamond film 216 for good electrical isolation plus good thermal conduction. The steps are as follows:

(a) Begin with silicon substrate 202 which is formed of 150 micron thick n type layer 204, 5 micron thick p+ type layer 206, 2 micron thick n type layer 208, and 3 micron thick n+ type layer 210. Clean silicon substrate 202 with dilute HF, and deposit 1 micron thick diamondlike layer 214 on silicon substrate 202 by direct ion beam deposition. Etch with atomic hydrogen and grow 10 micron thick diamond layer 216 in reactor 110 from a 1% methane in hydrogen gas mixture. See FIG. 4a.

Figure 4A:
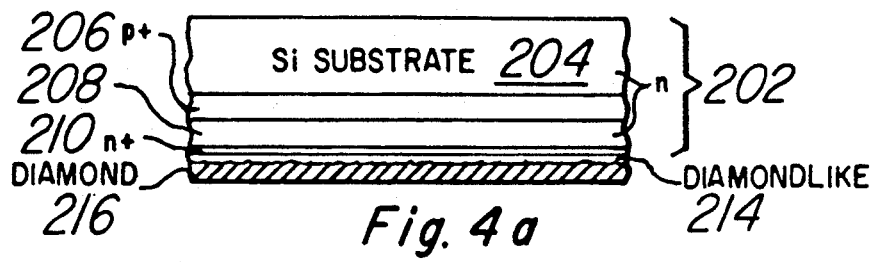
Figure 4B:
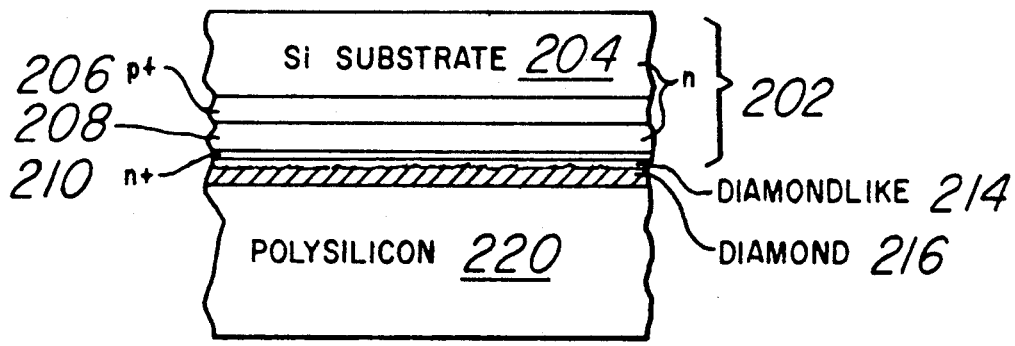
Figure 4C:
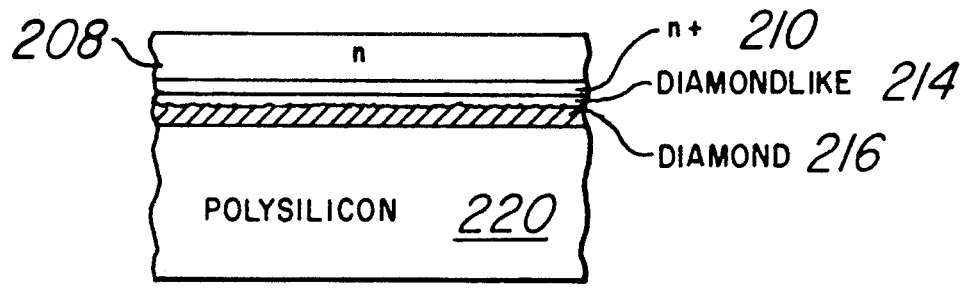

(b) Deposit 150 microns of polysilicon 220 on diamond 216 by LPCVD; see FIG. 4b. Polysilicon 220 will form the resultant substrate for the silicon-on-diamond structure.

(c) Remove layer 204 by first polishing it down to a thickness of about 50 microns, this is not a critical thickness, and then etching the remainder of layer 204 with an aqueous solution of KOH and propanol which is selective and stops on p+ layer 206. Next, etch layer 206 with a solution of HF, $HNO_3$, and acetic acid which is selective and stops on n layer 208. See FIG. 4c which illustrates a silicon-on-diamond substrate.

Figure 4D:
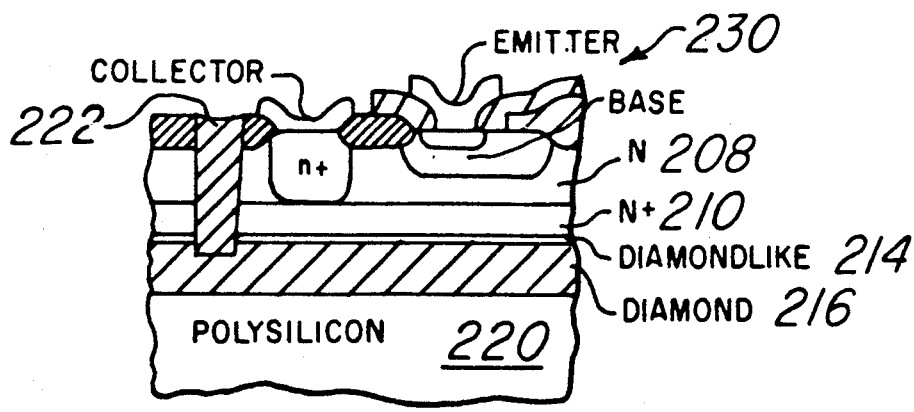

(d) Form devices with standard silicon processing techniques in silicon layer 208 with layer 210 constituting a buried layer. For example, trench isolation 222 and n-p-n bipolar transistor 230 are schematically shown in FIG. 4d. Similarly, CMOS or BiCMOS or other technologies could be fabricated in silion-on-diamond, and the buried layer can be easily adapted to the technologies being integrated. Emitter-coupled-logic (ECL) using bipolar transistors generates a large amount of heat, and fabricating such circuitry in silicon-on-diamond layer 208 permits good electrical isolation in addition to good thermal dissipation by diamond 216. Because diamondlike layer 214 is not as good a thermal conductor as diamond layer 216, the thickness of diamondlike layer 214 is kept to a minimum that is still convenient for processing.

MODIFICATIONS AND ADVANTAGES

Various modifications of the preferred embodiment devices and methods may be made while retaining the features of a diamond layer on a diamondlike layer. For example, DC discharge or microwave discharge processes may be used in place of the hot filament process described in the first preferred embodiment for either or both of the growth of the diamond layer and the diamondlike layer. Also, other hydrocarbons or carbon-bearing materials, such as ethanol, may be used with the hydrogen in the hot filament process. And various substrate materials may be used.

The invention provides the advantages of providing a high density of sites for diamond film nucleation. These nucleation sites occur on the surface of a diamondlike film. The overgrown diamond film is very uniform due to the high density of the diamond nucleation sites.

What is claimed is:

1. A method of diamond film formation on a body, comprising the steps of:
    (a) forming a film of diamondlike material on a body; and
    (b) forming a film of diamond on said diamondlike material.

2. The method of claim 1, comprising the further step of:
    (a) after forming said film of diamondlike material of step (a) but prior to forming said film of diamond on said diamondlike material of step (b), etching said film of diamondlike material with atomic hydrogen.

3. The method of claim 2, wherein:
    (a) said forming of said diamond material is by pyrolysis of carbon-bearing material plus hydrogen.

4. The method of claim 2, wherein:
    (a) said forming of said diamondlike material is by pyrolysis of carbon-bearing material plus hydrogen.

5. The method of claim 1, further comprising the step of:
    (a) prior to step (a), abrading a surface of said body with diamond grit.

6. The method of claim 1, wherein:
    (a) said body is silicon.

7. A diamond film growth method, comprising the steps of:
    (a) growing a film of diamondlike material;

(b) selectively removing graphitic-bonded material from a surface of said film of diamondlike material; and
(c) growing a film of diamond on said surface.

8. The method of claim 7, wherein:
(a) said selective removal is by etching with atomic hydrogen.

9. The method of claim 7, wherein:
(a) said growing a film of diamondlike material is by pyrolysis of carbon-bearing material plus hydrogen; and
(b) said growing a film of diamond material is by pyrolysis of carbon-bearing material plus hydrogen.

* * * * *